(12) United States Patent
Kang et al.

(10) Patent No.: US 11,706,960 B2
(45) Date of Patent: Jul. 18, 2023

(54) DISPLAY DEVICE AND METHOD OF MANUFACTURING THE SAME

(71) Applicant: Samsung Display Co., Ltd., Yongin-si (KR)

(72) Inventors: Eui Jeong Kang, Suwon-si (KR); Seung-Soo Ryu, Hwaseong-si (KR); Sanghyuck Yoon, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/190,374

(22) Filed: Mar. 2, 2021

(65) Prior Publication Data
US 2021/0376043 A1 Dec. 2, 2021

(30) Foreign Application Priority Data
Jun. 1, 2020 (KR) .................. 10-2020-0065839

(51) Int. Cl.
*H10K 59/131* (2023.01)
*G09G 3/3225* (2016.01)
*H10K 59/124* (2023.01)
*H10K 59/12* (2023.01)

(52) U.S. Cl.
CPC ......... *H10K 59/131* (2023.02); *G09G 3/3225* (2013.01); *H10K 59/124* (2023.02); *G09G 2300/0426* (2013.01); *H10K 59/1201* (2023.02)

(58) Field of Classification Search
CPC . H01L 27/32; H01L 27/3276; H01L 27/3258; H01L 51/56; H01L 24/10; H01L 24/13; H01L 24/15; H01L 24/16; H01L 24/17; H01L 23/49816; G09G 3/3225; H10K 59/131; H10K 59/124
See application file for complete search history.

(56) References Cited

U.S. PATENT DOCUMENTS

| | | | |
|---|---|---|---|
| 9,899,344 B2 * | 2/2018 | Lin | ............ H01L 23/49894 |
| 10,217,806 B2 | 2/2019 | Kim et al. | |
| 10,504,986 B2 * | 12/2019 | Kim | ............ H01L 27/3276 |
| 10,686,027 B2 * | 6/2020 | Jo | ............ H05K 1/189 |
| 2017/0362361 A1 * | 12/2017 | Hsu | ............ C08F 220/32 |
| 2021/0375804 A1 | 12/2021 | Kang et al. | |

FOREIGN PATENT DOCUMENTS

| | | |
|---|---|---|
| CN | 106298863 | 1/2017 |
| KR | 10-2018-0000046 | 1/2018 |
| KR | 10-2019-0093184 | 8/2019 |
| KR | 10-2021-0149265 | 12/2021 |

* cited by examiner

*Primary Examiner* — Sardis F Azongha
(74) *Attorney, Agent, or Firm* — H.C. Park & Associates, PLC

(57) ABSTRACT

A display device includes a substrate, a driving pad disposed on the substrate, an insulating layer covering the driving pad, disposed on the substrate, and including an engraved pattern through which at least a portion of the driving pad is exposed, and a circuit board including a circuit pad having a shape inserted into the engraved pattern and making contact with the driving pad.

17 Claims, 11 Drawing Sheets

DISPLAY DEVICE AND METHOD OF MANUFACTURING THE SAME

CROSS-REFERENCE TO RELATED APPLICATION

This application claims priority from and the benefit of Korean Patent Application No. 10-2020-0065839, filed on Jun. 1, 2020, which is hereby incorporated by reference for all purposes as if fully set forth herein.

BACKGROUND

Field

Embodiments and implementations of the invention relate generally to a display device. More particularly, the inventive concepts relate to a display device and a method of manufacturing the display device.

Discussion of the Background

Various display devices that are applied to multimedia devices, such as televisions, mobile phones, tablet computers, navigation units, and game units, are being developed.

The display devices include a display panel displaying images. The display panel includes gate lines, data lines, and pixels connected to the gate lines and the data lines. The display panel is electrically connected to circuit boards and electronic components that provide electrical signals required to display the images to the gate lines or the data lines.

The circuit boards and electronic components are electrically connected to the display panel using a variety of methods. For instance, as pads of the circuit boards are in contact with pads of the display panel, the circuit boards are electrically connected to the display panel.

The above information disclosed in this Background section is only for understanding of the background of the inventive concepts, and, therefore, it may contain information that does not constitute prior art.

SUMMARY

The inventive concepts provide a display device capable of improving a bonding reliability between a pad of a display panel and a pad of a circuit board.

The inventive concepts provide a method of manufacturing the display device.

Additional features of the inventive concepts will be set forth in the description which follows, and in part will be apparent from the description, or may be learned by practice of the inventive concepts.

Embodiments of the inventive concept provide a display device including a substrate, a driving pad disposed on the substrate, an insulating layer covering the driving pad, disposed on the substrate, and including an engraved pattern through which at least a portion of the driving pad is exposed, and a circuit board including a circuit pad having a shape inserted into the engraved pattern and making contact with the driving pad.

The shape of the circuit pad is substantially the same shape as a shape of the engraved pattern.

The engraved pattern has a height that is the same as a height of the circuit pad in a thickness direction of the substrate.

A height of the circuit pad is greater than a height of the engraved pattern in a thickness direction of the substrate.

The display device further includes a filling agent disposed between the circuit board and the insulating layer.

The insulating layer includes a first insulating layer disposed on the substrate and a second insulating layer disposed on the first insulating layer, and each of the first insulating layer and the second insulating layer is an organic layer.

The driving pad includes a first pad disposed on the substrate and a second pad partially covered by the second insulating layer, disposed on the exposed first pad through the engraved pattern, and making contact with the circuit pad. At least a portion of the first pad is exposed by the first insulating layer, and the first pad and the second pad include different materials from each other.

The engraved pattern has a shape recessed from an upper surface of the second insulating layer to expose the driving pad.

The circuit board further includes a support layer that supports the circuit pad, and the circuit pad includes a first circuit pad disposed on the support layer and a second circuit pad covering the first circuit pad and facing the driving pad.

The circuit pad includes a plurality of circuit pads spaced apart from each other, and the second insulating layer is disposed between two circuit pads adjacent to each other among the circuit pads.

The second insulating layer makes contact with the two adjacent circuit pads and the support layer.

The second insulating layer includes a photo-initiator and has an adhesive component.

The insulating layer surrounds the driving pad in a plane.

The engraved pattern has a shape opened from the insulating layer in a plane.

Each of the driving pad and the circuit pad has a trapezoid shape in the plane.

Embodiments of the inventive concepts provide a method of manufacturing a display device. The method includes providing a display substrate including an insulating layer through which an engraved pattern is defined and a driving pad partially exposed through the engraved pattern, aligning a circuit pad of a circuit board to face the driving pad of the display substrate in a thickness direction of the display substrate, and inserting the circuit pad into the engraved pattern to allow the circuit pad to make contact with the driving pad, and the circuit pad has a shape that is the same as a shape of the engraved pattern in a plane.

The method further includes filling a filling agent between the circuit board and the insulating layer, and the circuit pad has a height greater than a height of the engraved pattern in a thickness direction of the display substrate.

The method further includes curing the insulating layer after the inserting of the circuit pad into the engraved pattern, and the insulating layer has an adhesive component and includes a photo-initiator.

The insulating layer surrounds the driving pad in the plane, and the engraved pattern has a shape recessed from an upper surface of the insulating layer.

Embodiments of the inventive concepts provide a method of manufacturing a display device. The method includes providing a display substrate including an insulating layer through which an engraved pattern is defined and extends in one direction and a driving pad partially exposed through the engraved pattern, aligning a circuit pad of a circuit board to face the driving pad of the display substrate in the one direction, and inserting the circuit pad into the engraved pattern in the one direction to allow the circuit pad to make contact with the driving pad.

According to the above, the display panel includes the engraved pattern through which the driving pattern is exposed, and the circuit board includes the circuit pad inserted into the engraved pattern. Particularly, as the driving pad and the circuit pad are connected directly to each other without using a separate conductive adhesive member, a manufacturing process of the display device may be simplified, and the process cost of the display device may be reduced.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1A:
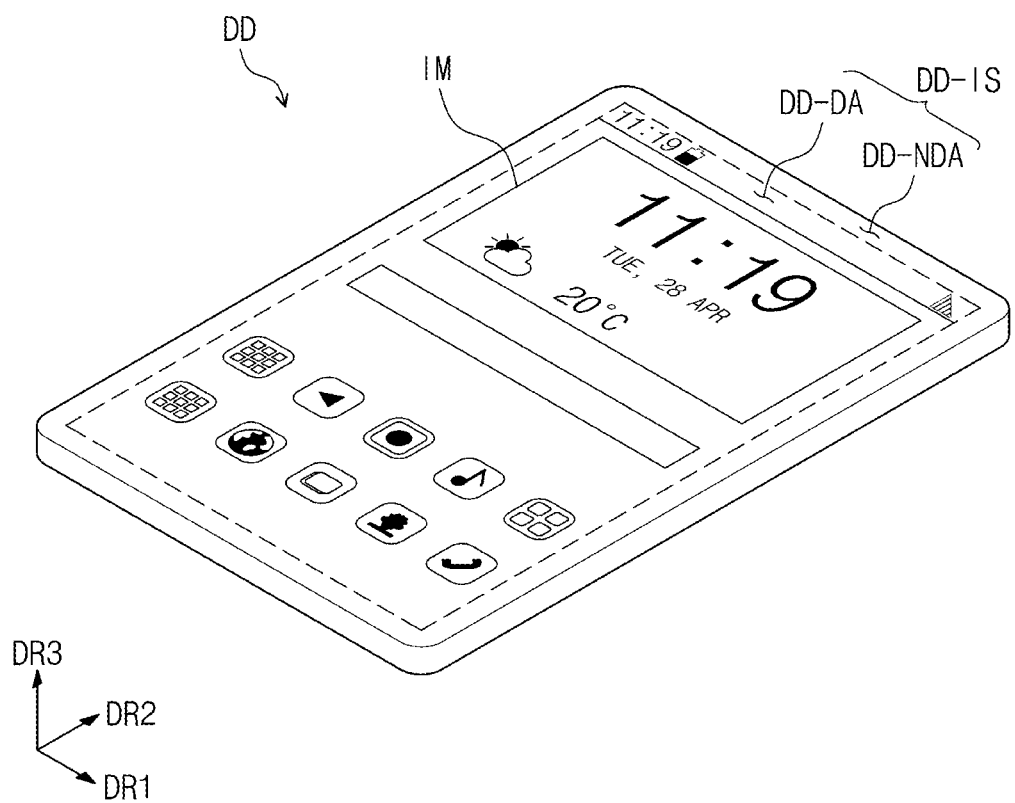
FIG. 1A is a perspective view illustrating a display device according to an embodiment of the inventive concepts.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are illustrated in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another.

Furthermore, the apparatus may be otherwise oriented (e.g., rotated 90 degrees or at other orientations), and, as such, the spatially relative descriptors used herein interpreted accordingly.

It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

It will be understood that when an element (or an area, a layer, and a portion) or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments and is not intended to be limiting. It will be further understood that the terms "comprises," "comprising," "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, the inventive concepts will be explained in detail with reference to the accompanying drawings.

Figure 1B:
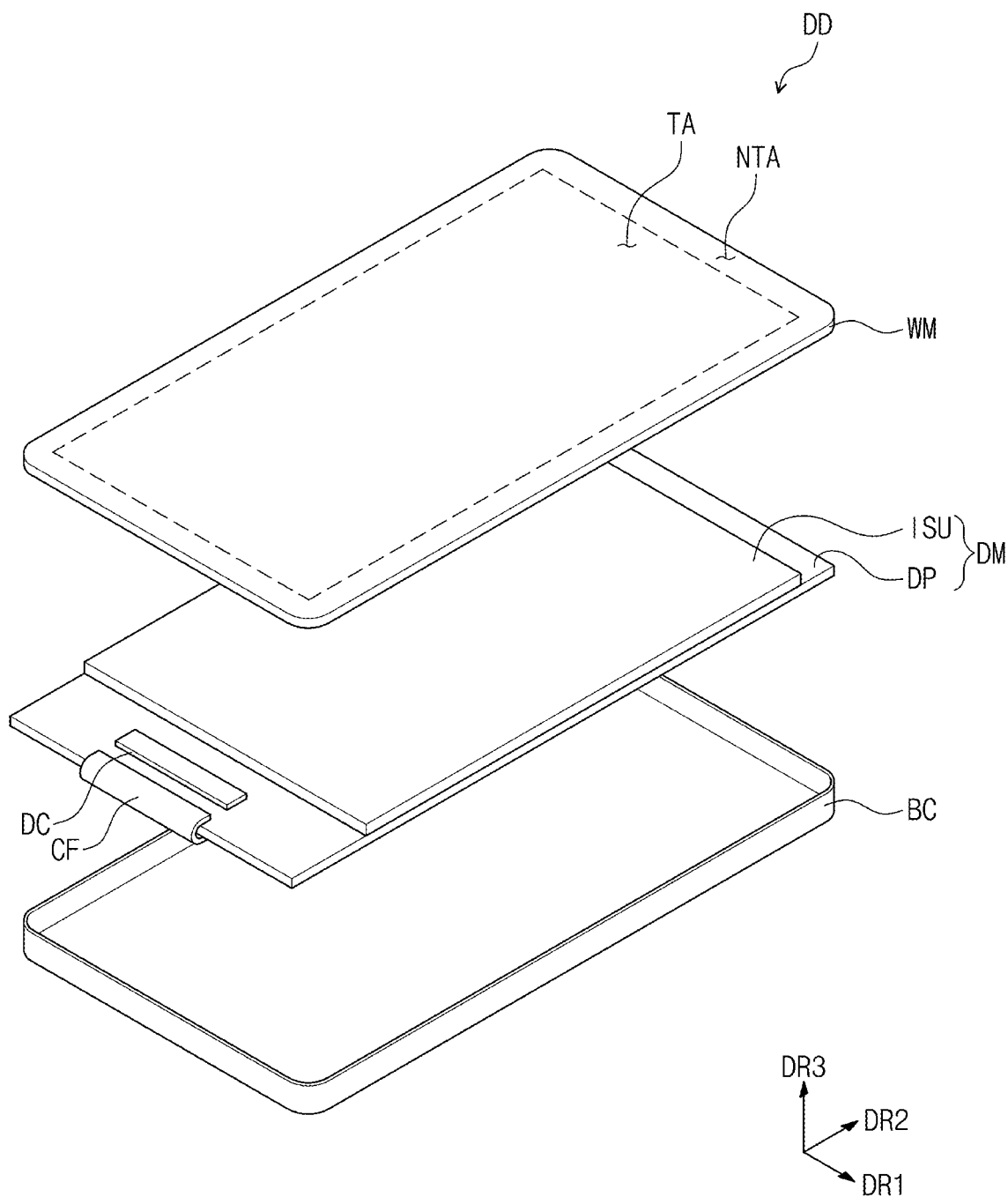
FIG. 1B is an exploded perspective view illustrating a display device according to an embodiment of the inventive concepts.
Figure 2:
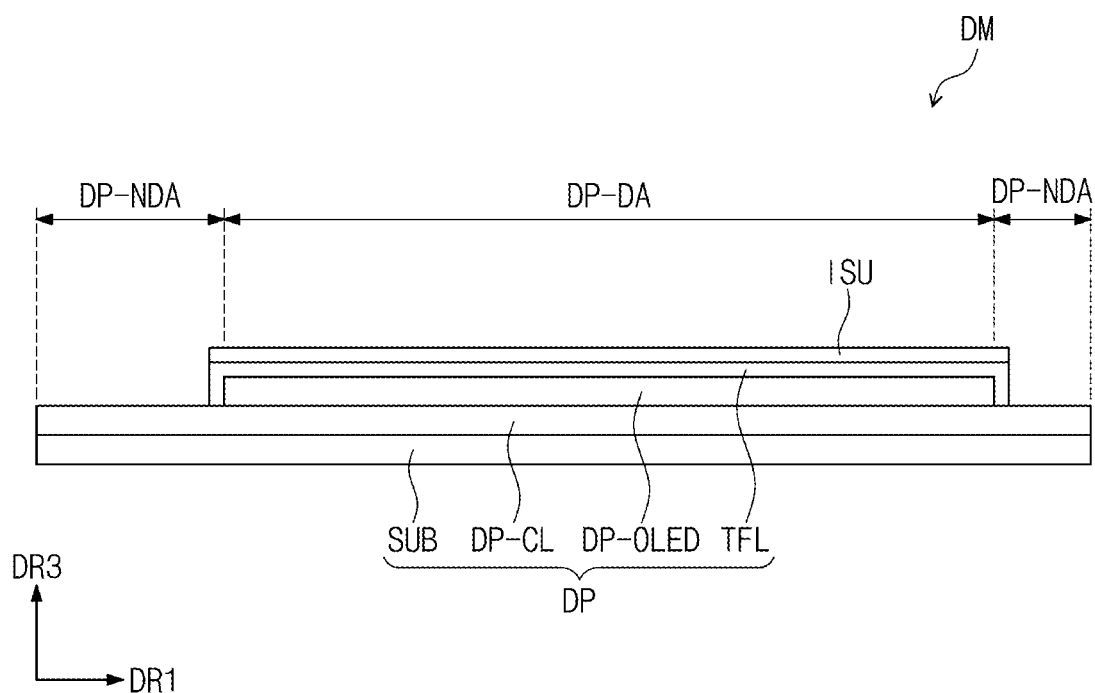
FIG. 2 is a cross-sectional view illustrating a display module according to an embodiment of the inventive concepts.

FIG. 1A is a perspective view illustrating a display device DD according to an embodiment of the inventive concepts. FIG. 1B is an exploded perspective view illustrating the display device DD according to an embodiment of the inventive concepts. FIG. 2 is a cross-sectional view illustrating a display module DM according to an embodiment of the inventive concepts.

In the inventive concepts, the display device DD that may be applied to a mobile phone terminal is illustrated as a representative example. Although not illustrated in the drawing figures, electronic modules mounted on a main board, a camera module, and a power supply module may be accommodated in a bracket and a case together with the display device DD, and thus the mobile phone terminal may be formed. The display device DD according to the inventive concepts may be applied to a large-sized electronic item, such as a television set and a monitor, and a small and medium-sized electronic item, such as a tablet computer, a car navigation unit, a game unit, and a smart watch.

Referring to FIG. 1A, the display device DD displays an image IM through a display surface DD-IS. FIG. 1A illustrates icon images as a representative example of the image IM. The display surface DD-IS is substantially parallel to a plane defined by a first direction DR1 and a second direction DR2. A third direction DR3 indicates a normal line direction of the display surface DD-IS, i.e., a thickness direction of the display device DD. In the following descriptions, an expression "when viewed in a plane" or "in a plane" may mean a case of being viewed in the third direction DR3. Hereinafter, front (or upper) and rear (or lower) surfaces of each layer or each unit of the display device DD are distinct from each other by the third direction DR3. However, directions indicated by the first, second, and third directions DR1, DR2, and DR3 are relative to each other, and thus the directions indicated by the first, second, and third directions DR1, DR2, and DR3 may be changed to other directions, e.g., opposite directions.

In addition, the display surface DD-IS includes a display area DD-DA through which the image IM is displayed and a non-display area DD-NDA disposed adjacent to the display area DD-DA. The image IM is not displayed through the non-display area DD-NDA, however, it should not be limited thereto or thereby. The non-display area DD-NDA may be adjacent to one side of the display area DD-DA or may be omitted.

Referring to FIG. 1B, the display device DD may include a window WM, a display module DM, a driving chip DC, a circuit board CF, and an accommodating member BC. The accommodating member BC may accommodate the display module DM and may be coupled to the window WM.

The window WM may be disposed on the display module DM and may transmit an image provided from the display module DM to the outside. The window WM may include a transmission area TA and a non-transmission area NTA. The transmission area TA may overlap the display area DD-DA and may have a shape corresponding to the display area DD-DA. The image IM displayed through the display area DD-DA of the display device DD may be perceived from the outside through the transmission area TA of the window WM.

The non-transmission area NTA may overlap the non-display area DD-NDA and may have a shape corresponding to the non-display area DD-NDA. The non-transmission area NTA may have a relatively low light transmittance compared with the transmission area TA. However, the inventive concepts should not be limited thereto or thereby, and the non-transmission area NTA may be omitted.

The window WM may include a glass, sapphire, or plastic material. The window WM is illustrated to have a single-layer structure, however, the window WM may include a plurality of layers. The window WM may include a base layer and at least one printed layer overlapping the non-transmission area NTA and disposed on a rear surface of the base layer. The printed layer may have a predetermined color. As an example, the printed layer may have a black color or may have other colors rather than the black color.

The display module DM is disposed between the window WM and the accommodating member BC. The display module DM includes a display panel DP and an input sensing layer ISU. The display panel DP generates the image and provides the generated image to the window WM.

The display panel DP according to the embodiment of the inventive concepts may be a light emission type display panel, however, it should not be particularly limited. For instance, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot and a quantum rod. Hereinafter, the organic light emitting display panel will be described as a representative example of the display panel DP. However, the inventive concepts should not be limited to the organic light emitting display panel, and various display panels may be applied to the inventive concepts. In addition, the display panel DP has a rigidity, but the display panel DP may have a flexibility in such a way that the display panel DP may be folded with respect to a folding axis or may be curved along one direction.

Referring to FIG. 2, the display panel DP includes a substrate SUB, a circuit element layer DP-CL disposed on the substrate SUB, a display element layer DP-OLED disposed on the circuit element layer DP-CL, and an encapsulation layer TFL disposed on the display element layer DP-OLED.

The display panel DP includes a display area DP-DA and a non-display area DP-NDA. The display area DP-DA of the display panel DP corresponds to the display area DD-DA illustrated in FIG. 1A or the transmission area TA illustrated in FIG. 1B, and the non-display area DP-NDA of the display panel DP corresponds to the non-display area DD-NDA illustrated in FIG. 1A or the non-transmission area NTA illustrated in FIG. 1B.

The substrate SUB may include at least one plastic film. As an example, the substrate SUB may include a plastic substrate, a glass substrate, a metal substrate, or an organic/inorganic composite substrate as a flexible substrate. The substrate SUB may be a member that supports components of the display panel DP, and will be described as a display substrate in the following descriptions.

The circuit element layer DP-CL includes at least one insulating interlayer and a circuit element. The insulating interlayer includes at least one intermediate inorganic layer and/or at least one intermediate organic layer. The circuit element includes signal lines and a pixel driving circuit.

The display element layer DP-OLED includes a plurality of organic light emitting diodes. The display element layer DP-OLED further includes an organic layer such as a pixel definition layer. According to another embodiment, when the liquid crystal display panel is used as the display panel, the display element layer may be a liquid crystal layer.

The encapsulation layer TFL encapsulates the display element layer DP-OLED. As an example, the encapsulation layer TFL may be a thin film encapsulation layer. The encapsulation layer TFL protects the display element layer DP-OLED from moisture, oxygen, and a foreign substance such as dust particles, however, it should not be limited thereto or thereby. An encapsulation substrate may be used instead of the encapsulation layer TFL. In this case, the encapsulation substrate may face the substrate SUB, and the circuit element layer DP-CL and the display element layer DP-OLED may be disposed between the encapsulation substrate and the substrate.

The input sensing layer ISU may be disposed between the window WM and the display panel DP. The input sensing layer ISU may sense an input applied from the outside. The input applied from the outside may be provided in various forms. For example, the external input may include various forms, such as a part of the user's body, a stylus pen, light, heat, or pressure. Also, in addition to an input by contacting a part of user's body, such as a user's hand, a proximity or approaching space touch (e.g., hovering) may be a form of the external input.

The input sensing layer ISU may be disposed directly on the display panel DP. In the inventive concepts, the expression "component A is disposed directly on component B" refers to that no intervening elements, such as an adhesive layer, are present between the component A and the component B. The input sensing layer ISU may be formed together with the display panel DP through successive processes. However, the inventive concepts should not be limited thereto or thereby. The input sensing layer ISU may be coupled to the display panel DP by an adhesive layer after being provided as a separate panel. As another example, the input sensing layer ISU may be omitted.

Referring to FIG. 1B again, the driving chip DC may overlap the non-display area DP-NDA and may be disposed on the display panel DP. For instance, the driving chip DC may generate driving signals used for an operation of the display panel DP based on control signals provided from the circuit board CF. The driving chip DC may transmit the generated driving signals to the circuit element layer DP-CL of the display panel DP.

The circuit board CF is electrically connected to the display module DM. Referring to FIG. 1B, the circuit board CF is connected to the display panel DP, however, the circuit board CF may be electrically connected to each of the display panel DP and the input sensing layer ISU.

According to the embodiment of the inventive concepts, the circuit board CF may be connected directly to the display panel DP without using a separate conductive adhesive member. For instance, a circuit pad included in the circuit board CF and a driving pad included in the display panel DP may be in contact directly with each other. This will be described in detail with reference to FIG. 4.

Figure 3:
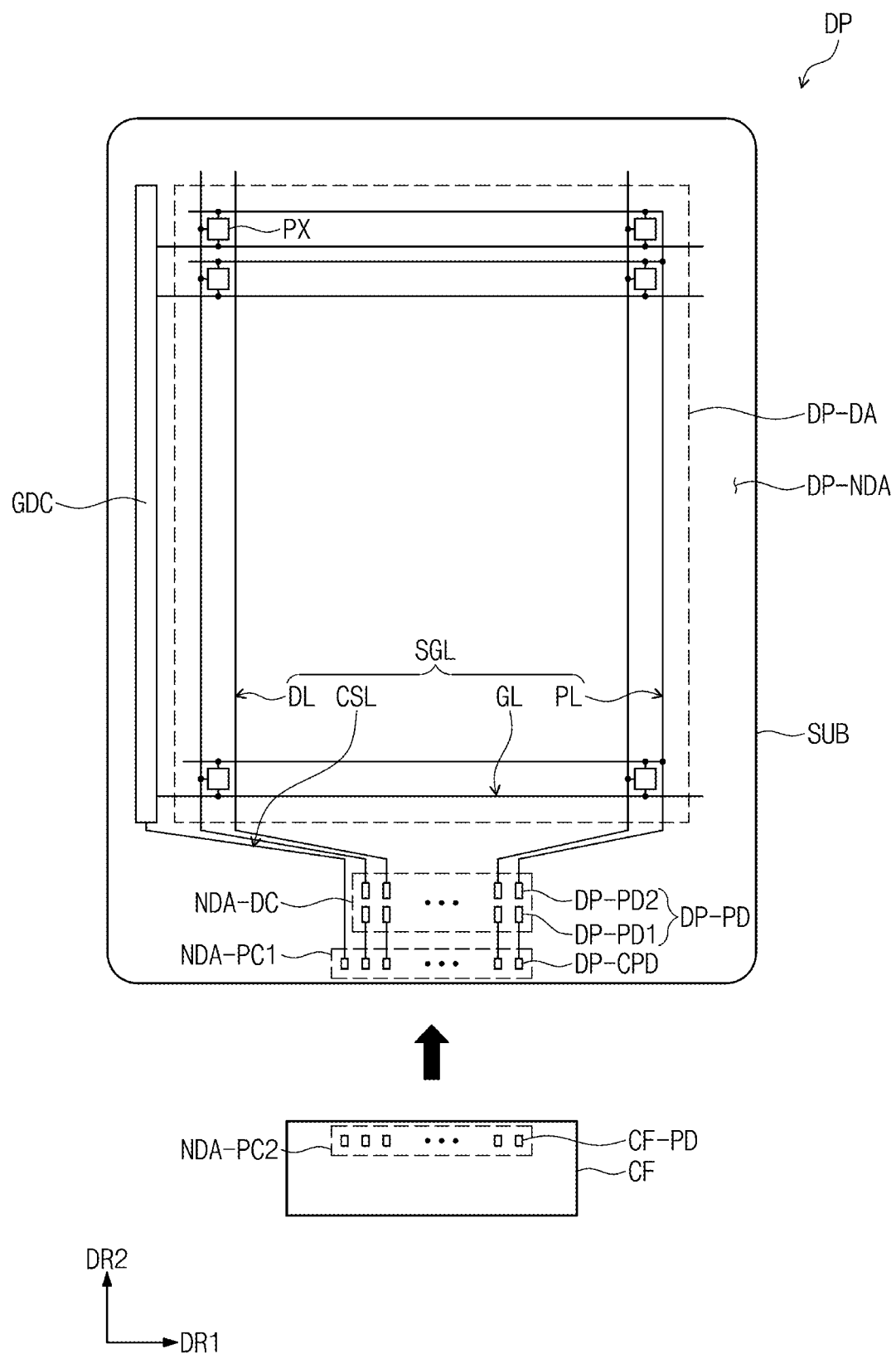
FIG. 3 is a plan view illustrating a display panel according to an embodiment of the inventive concepts.

FIG. 3 is a plan view illustrating the display panel DP according to an embodiment of the inventive concepts.

Referring to FIG. 3, the display panel DP may include a driving circuit GDC, a plurality of signal lines SGL, a plurality of first driving pads DP-PD, a plurality of second driving pads DP-CPD, and a plurality of pixels PX. The pixels PX may be arranged in the display area DP-DA. Each of the pixels may include the organic light emitting diode and the pixel driving circuit connected to the organic light emitting diode. The driving circuit GDC, the signal lines SGL, the first driving pads DP-PD, the second driving pads DP-CPD, and the pixel driving circuit may be included in the circuit element layer DP-CL illustrated in FIG. 2.

The driving circuit GDC sequentially outputs gate signals to the gate lines GL. The driving circuit GDC further outputs another control signal to the pixels PX. The driving circuit GDC may include a plurality of thin film transistors formed through the same processes, e.g., a low temperature polycrystalline silicon (LTPS) process or a low temperature polycrystalline oxide (LTPO) process, as the pixel driving circuit of the pixels PX.

The signal lines SGL include the gate lines GL, data lines DL, a power line PL, and a control signal line CSL. Each of the gate lines GL is connected to a corresponding pixel among the pixels PX, and each of the data lines DL is connected to a corresponding pixel among the pixels PX. The power line PL is connected to the pixels PX. The control signal line CSL provides the control signals to the driving circuit.

The signal lines SGL overlap the display area DP-DA and the non-display area DP-NDA. Each of the signal lines SGL includes a pad portion and a line portion. The line portion overlaps the display area DP-DA and the non-display area DP-NDA. The pad portion is connected to an end of the line portion. The pad portion is disposed in the non-display area DP-NDA and overlaps a corresponding signal pad among the first driving pads DP-PD.

Hereinafter, an area in which the first driving pads DP-PD are arranged in the non-display area DP-NDA may be referred to as a "chip area NDA-DC", and an area in which the second driving pads DP-CPD are arranged in the non-display area DP-NDA may be referred to as a "first pad area NDA-PC1".

According to an embodiment, the driving chip DC illustrated in FIG. 1B may be mounted on the chip area NDA-DC. The first driving pads DP-PD may be electrically connected to the driving chip DC to transmit electrical signals provided from the driving chip DC to the signal lines SGL, however, it is should not be limited thereto or thereby, and the driving chip DC illustrated in FIG. 1B may be mounted on the circuit board CF. In this case, the first driving pads DP-PD may be omitted.

In detail, the first driving pads DP-PD include first-row driving pads DP-PD1 arranged in a first row along the first direction DR1 and second-row driving pads DP-PD2 arranged in a second row along the first direction DR1, however, they should not be limited thereto or thereby. That is, the first driving pads DP-PD may be arranged in one row along the first direction DR1.

A portion of the circuit board CF may be disposed in the first pad area NDA-PC1. The second driving pads DP-CPD are electrically connected to the circuit board CF and are configured to transmit electrical signals from the circuit board CF to the first driving pads DP-PD. The circuit board CF may be rigid or flexible. For example, when the circuit board CF is flexible, a flexible printed circuit board may be provided as the circuit board CF.

The circuit board CF may include a timing control circuit that controls an operation of the display panel DP. The timing control circuit may be mounted on the circuit board CF in the form of an integrated chip. In addition, although not illustrated in the drawing figures, the circuit board CF may include an input sensing circuit that controls the input sensing layer ISU.

The circuit board CF may include circuit pads CF-PD electrically connected to the display panel DP. The circuit pads CF-PD may be disposed in a second pad area NDA-PC2 defined in the circuit board CF.

Figure 4:
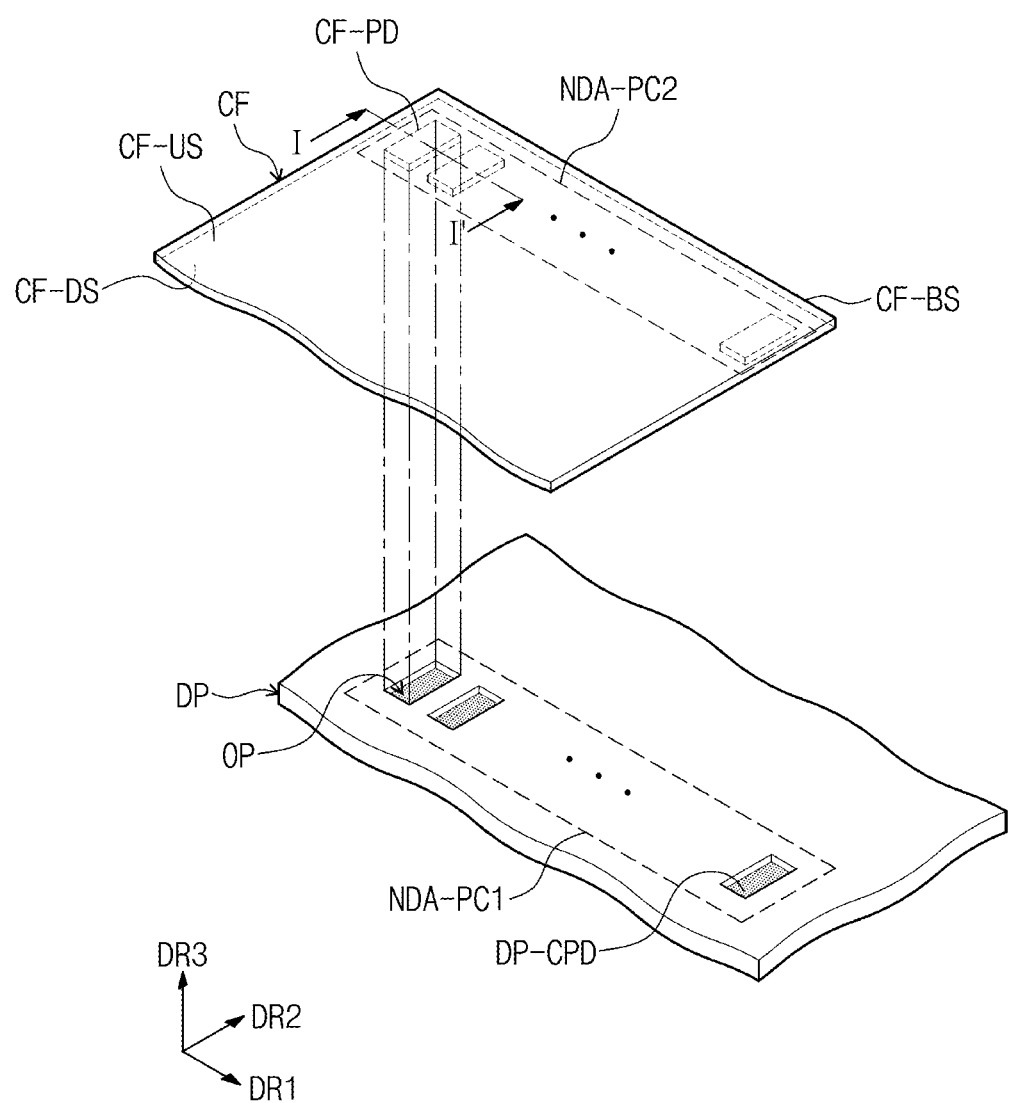
FIG. 4 is an exploded perspective view illustrating a display device according to an embodiment of the inventive concepts.
Figure 5:
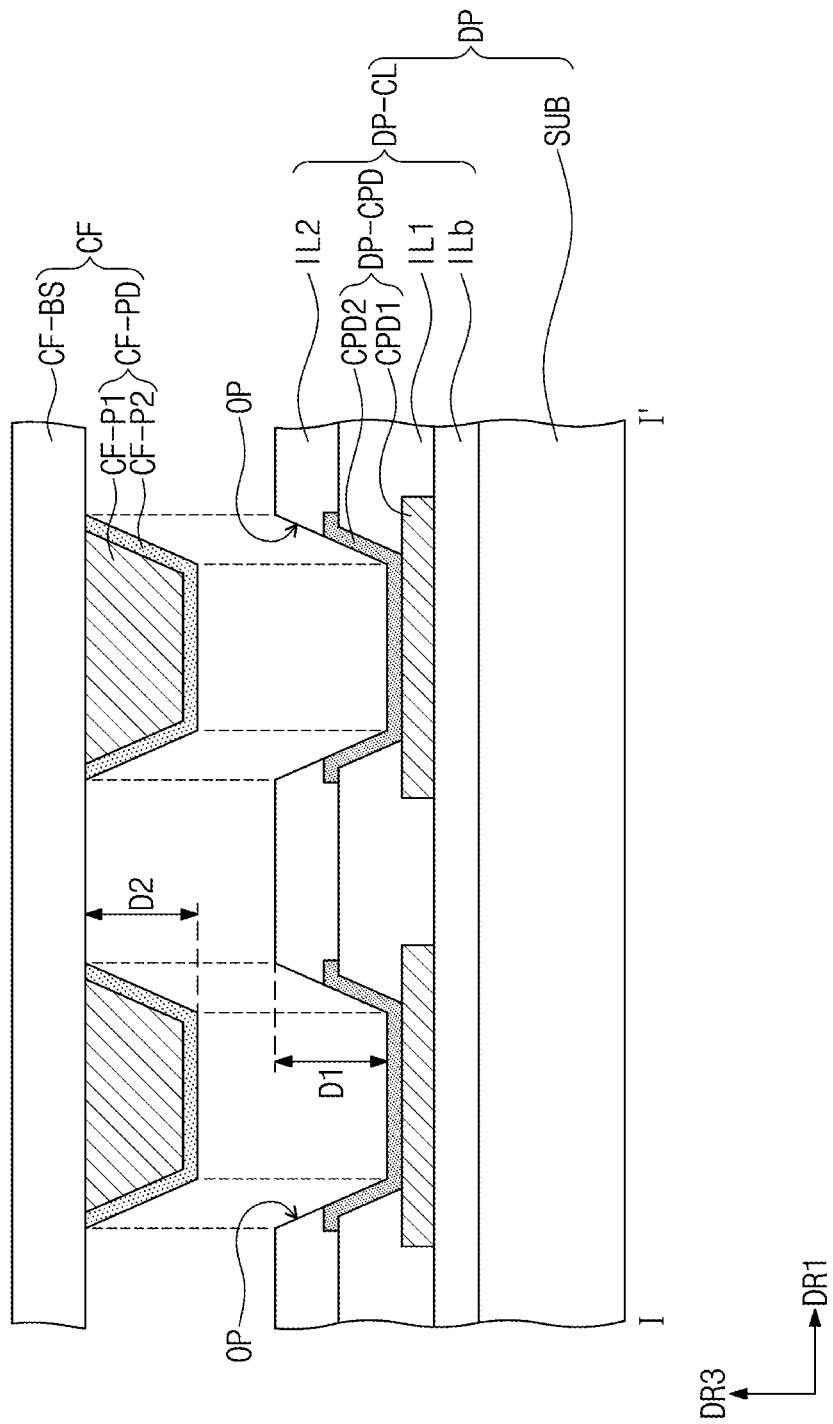
FIG. 5 is a cross-sectional exploded view taken along a line I-I' of FIG. 4 according to an embodiment of the inventive concepts.
Figure 6A:
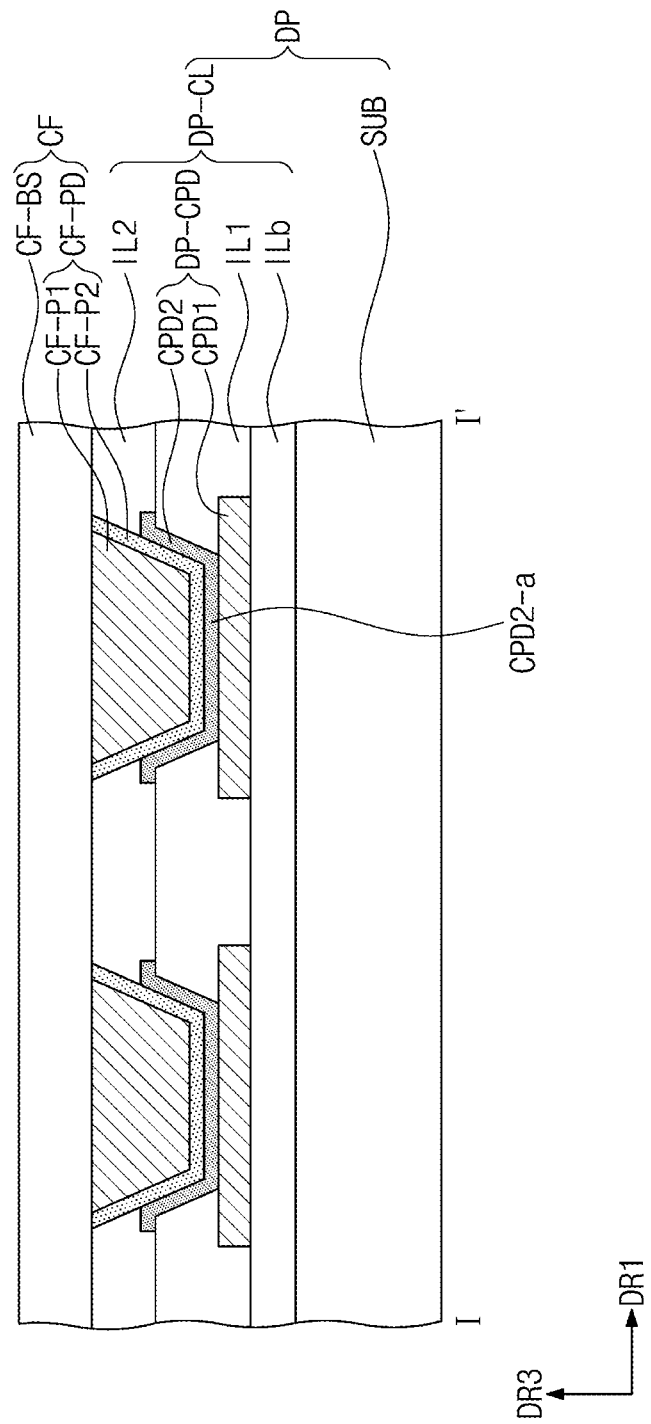
FIG. 6A is a cross-sectional exploded view taken along a line I-I' of FIG. 4 according to an embodiment of the inventive concepts.
Figure 6B:
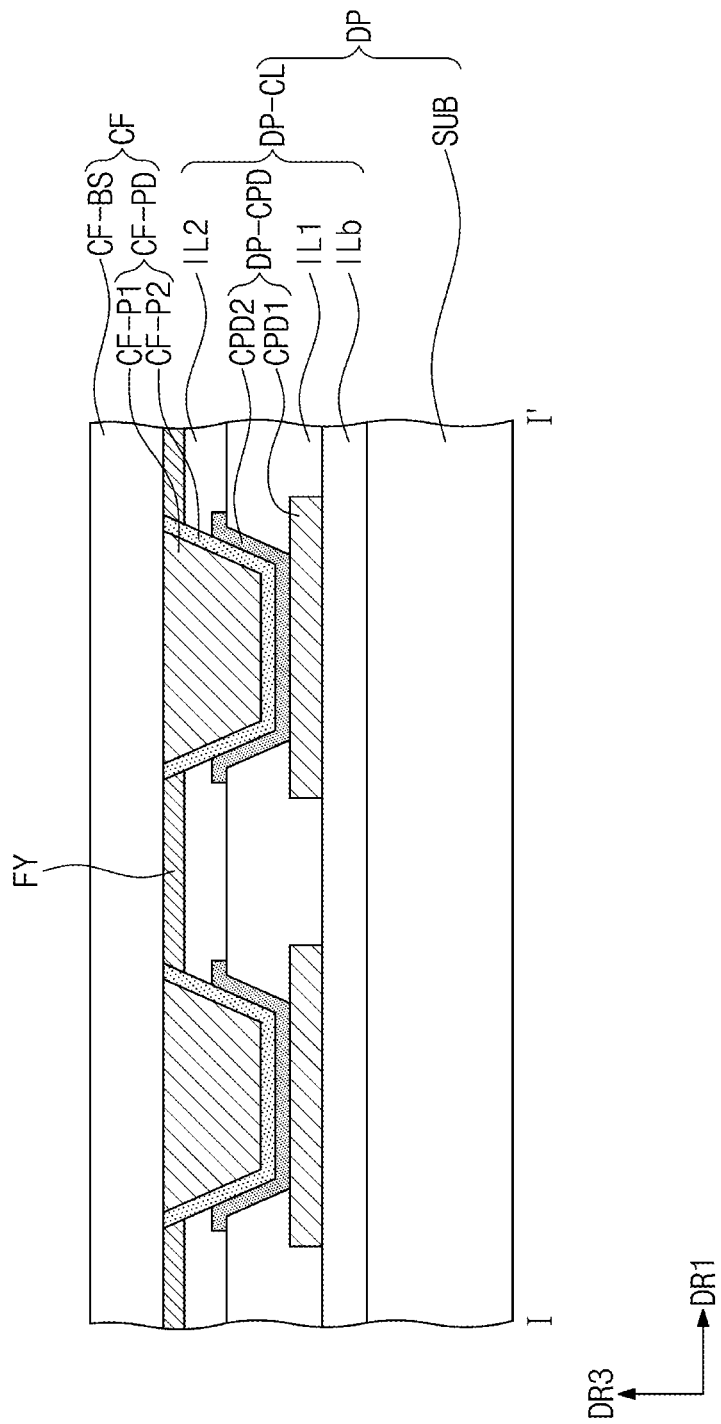
FIG. 6B is a cross-sectional exploded view taken along a line I-I' of FIG. 4 according to another embodiment of the inventive concepts.

FIG. 4 is an exploded perspective view illustrating a display device according to an embodiment of the inventive concepts. FIG. 5 is a cross-sectional exploded view taken along a line I-I' of FIG. 4 according to an embodiment of the inventive concepts. FIG. 6A is another cross-sectional exploded view taken along a line I-I' of FIG. 4 according to an embodiment of the inventive concepts. FIG. 6B is yet another cross-sectional exploded view taken along a line I-I' of FIG. 4 according to another embodiment of the inventive concepts.

Referring to FIG. 4, the display panel DP may include a plurality of engraved patterns OP defined therethrough to expose the second driving pads DP-CPD (hereinafter, referred to as "driving pads") in the first pad area NDA-PC1. The engraved patterns OP may have a shape recessed from an upper surface of the display panel DP in the third direction DR3.

The circuit board CF may include an upper surface CF-US and a lower surface CF-DS on which the circuit pads CF-PD are disposed. According to the inventive concepts, the driving pads DP-CPD and the circuit pads CF-PD may be electrically connected to each other without using a separate conductive adhesive member. For instance, the circuit pads CF-PD may be spaced apart from each other in a plane and may have a shape protruded from the lower surface CF-DS of the circuit board CF. The circuit pads CF-PD may have a structure inserted into the engraved patterns OP, respectively. As the circuit pads CF-PD are respectively inserted into the engraved patterns OP, the circuit pads CF-PD may be connected directly to the driving pads DP-CPD. The driving pads DP-CPD may be disposed at a bottom portion of the engraved patterns OP.

According to the inventive concepts, the circuit pads CF-PD may have substantially a same shape as the engraved patterns OP such that the circuit pads CF-PD may be respectively inserted into the engraved patterns OP. For instance, a shape in a plane of any one of the circuit pads CF-PD may be substantially the same as that of a corresponding engraved pattern OP. In the inventive concepts, the term "components have substantially the same" may refer to that the components have the same shape within a range including process errors occurring in the process of the display device.

As described above, because the driving pads DP-CPD and the circuit pads CF-PD may be electrically connected to each other without using the separate conductive adhesive member, a process cost of the display device may be reduced, and a process efficiency of the display device may be improved.

In detail, referring to FIG. 5, the display panel DP may include a substrate SUB, insulating layers ILb, IL1 and IL2 included in the circuit element layer DP-CL described with reference to FIG. 2, and the driving pads DP-CPD. Configurations of the circuit element layer DP-CL will be described with reference to FIG. 5, however, the circuit element layer DP-CL may include various configurations and stack structures.

According to the inventive concepts, at least one insulating layer may be disposed between the driving pads CP-CPD and the substrate SUB, and FIG. 5 illustrates a buffer insulating layer ILb, a first insulating layer IL1 and a second insulating layer IL2, which are stacked on the substrate SUB, as a representative example. The buffer insulating layer ILb may be disposed on the substrate SUB, and the driving pads DP-CPD may be disposed on the buffer insulating layer ILb. The buffer insulating layer ILb may be an inorganic layer or an organic layer.

The driving pads DP-CPD may include first pads CPD1 and second pads CPD2 disposed on the first pads CPD1. The first pads CPD1 and the second pads CPD2 may be electrically connected to each other.

The first pads CPD1 may be disposed on the buffer insulating layer ILb. The first insulating layer IL1 may cover the first pads CPD1 and may be disposed on the buffer insulating layer ILb. The first insulating layer IL1 may be provided with a first opening defined therethrough to expose at least a portion of the first pads CPD1. According to the inventive concepts, the first insulating layer IL1 may be an organic layer.

The second pads CPD2 may be disposed on the first insulating layer IL1. The second insulating layer IL2 may cover the second pads CPD2 and may be disposed on the first insulating layer IL1. In particular, the second insulating layer IL2 may be an organic layer and may be provided with a second opening defined therethrough to expose at least a portion of the second pads CPD2. As a result, the second insulating layer IL2 may partially cover the second pads CPD2 or may entirely expose the second pads CPD2.

According to the inventive concepts, the engraved patterns OP may be defined by the first opening and the second opening. The second pads CPD2 may be respectively exposed through the engraved patterns OP and may be defined by the first opening of the first insulating layer IL1 and the second opening of the second insulating layer IL2. In addition, the second pads CPD2 may be surrounded by the second insulating layer IL2 when viewed in a plane. That is, the engraved patterns OP may have a closed curve shape surrounded by the second insulating layer IL2 when viewed in a plane.

In addition, according to the inventive concepts, the first pads CPD1 and the second pads CPD2 may include different materials from each other. The first pads CPD1 may include a metal material, and the second pads CPD2 may include a transparent conductive layer. The transparent conductive layer may include indium tin oxide (ITO), indium zinc oxide (IZO), zinc oxide (ZnO), indium tin zinc oxide (ITZO), PEDOT, metal nanowire, graphene, or the like. The metal material may include molybdenum, silver, titanium, copper, aluminum, and an alloy thereof.

The circuit board CF may include a support layer CF-BS and the circuit pads CF-PD. Although not illustrated in the drawing figures, an insulating layer may be further disposed on the support layer CF-BS. As an example, the insulating layer may be disposed between the support layer CF-BS and the circuit pads CF-PD.

The circuit pads CF-PD may include a first circuit pad CF-P1 disposed on the support layer CF-BS and a second circuit pad CF-P2 covering the first circuit pad CF-P1 disposed on the support layer CF-BS. The second circuit pad CF-P2 may have a thickness smaller than that of the first circuit pad CF-P1. In the inventive concepts, the first circuit pad CF-P1 may include copper (Cu), and the second circuit pad CF-P2 may include tin (Sn). The second circuit pad CF-P2 may prevent the first circuit pad CF-P1 including copper (Cu) from being oxidized with air.

According to the embodiment of the inventive concepts, the circuit pads CF-PD may have substantially the same shape as that of the engraved patterns OP and may be respectively inserted into the engraved patterns OP. Hereinafter, an insertion structure between one engraved pattern among the engraved patterns OP and a circuit pad corresponding to the one engraved pattern among the circuit pads CF-PD will be described. Referring to FIG. 5, the engraved pattern OP may have a first height D1, and the circuit pad CF-PD may have a second height D2.

FIG. 6A illustrates the insertion structure between the circuit pad CF-PD and the engraved pattern OP. In this case, the height D1 of the engraved pattern OP and the second height D2 of the circuit pad CF-PD may be substantially the same as each other. Because the engraved pattern OP and the circuit pad CF-PD have the same height, the second insulating layer IL2 may be generally filled between the support layer CF-BS and the first insulating layer IL1 and the second insulating layer IL2 may be generally filled between two circuit pads adjacent to each other among the circuit pads CF-PD.

In the inventive concepts, the second insulating layer IL2 may correspond to an uppermost organic layer among configurations of the circuit element layer DP-CL overlapping the first pad area NDA-PC1 of the non-display area DP-NDA.

As illustrated in FIG. 6A, the second insulating layer IL2 may make contact with the circuit pads CF-PD and the support layer CF-BS. Particularly, the second insulating layer IL2 according to the inventive concepts may include an adhesive component and a photo-initiator. As described above, the circuit board CF and the display panel DP may be fixed to each other by the second insulating layer IL2 having the adhesive component.

In other words, the second pads CPD2 may include a bottom portion CPD2-a. Because the second insulating layer IL2 has an adhesive component, there may not be a separate adhesive component connected to or between the bottom portion CPD2-a of the second pads CPD2 and a matching bottom portion of the second circuit pad CF-P2.

Referring to FIG. 6B, an insertion structure between a circuit pad CF-PD and an engraved pattern OP according to another embodiment is illustrated. In this case, a height D1 of the engraved pattern OP and a height D2 of the circuit pad CF-PD may be different from each other. For instance, the second height D2 of the circuit pad CF-PD may be greater than the first height D1 of the engraved pattern OP. As a result, an inner space may be defined between a second insulating layer IL2 and the support layer CF-BS.

According to the inventive concepts, the display device DD may further include a filling agent FY filled between the second insulating layer IL2 and the support layer CF-BS. The filling agent FY may be disposed between the second insulating layer IL2 and the support layer CF-BS, and thus the second insulating layer IL2 and the support layer CF-BS may be fixed to each other by the filling agent FY. The filling agent FY may have an adhesive property. The filling agent FY may be cured by an external light after being formed between the second insulating layer IL2 and the support layer CF-BS.

Figure 7A:
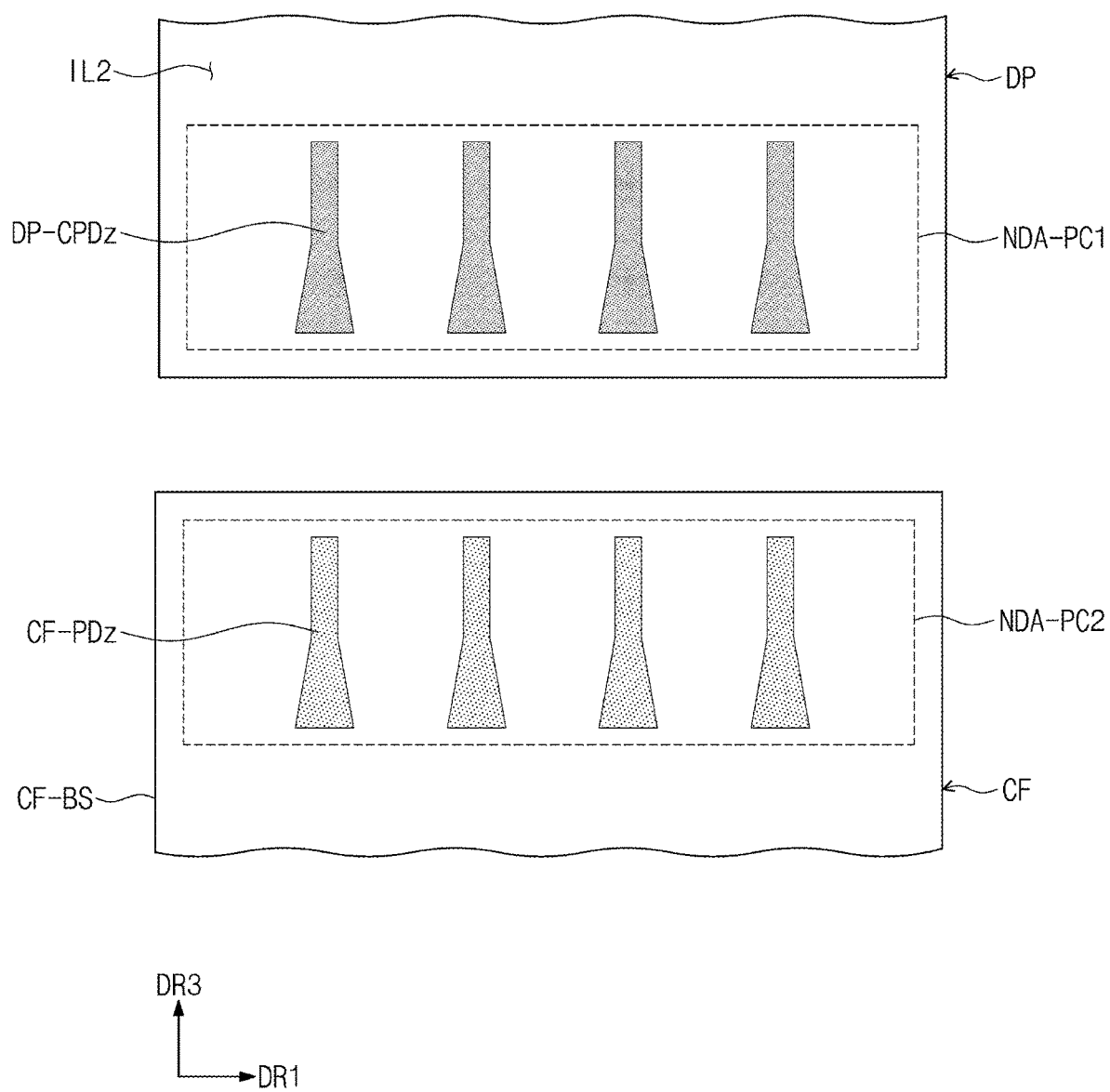
FIG. 7A is a plan view illustrating a circuit board and a display panel according to another embodiment of the inventive concepts.
Figure 7B:
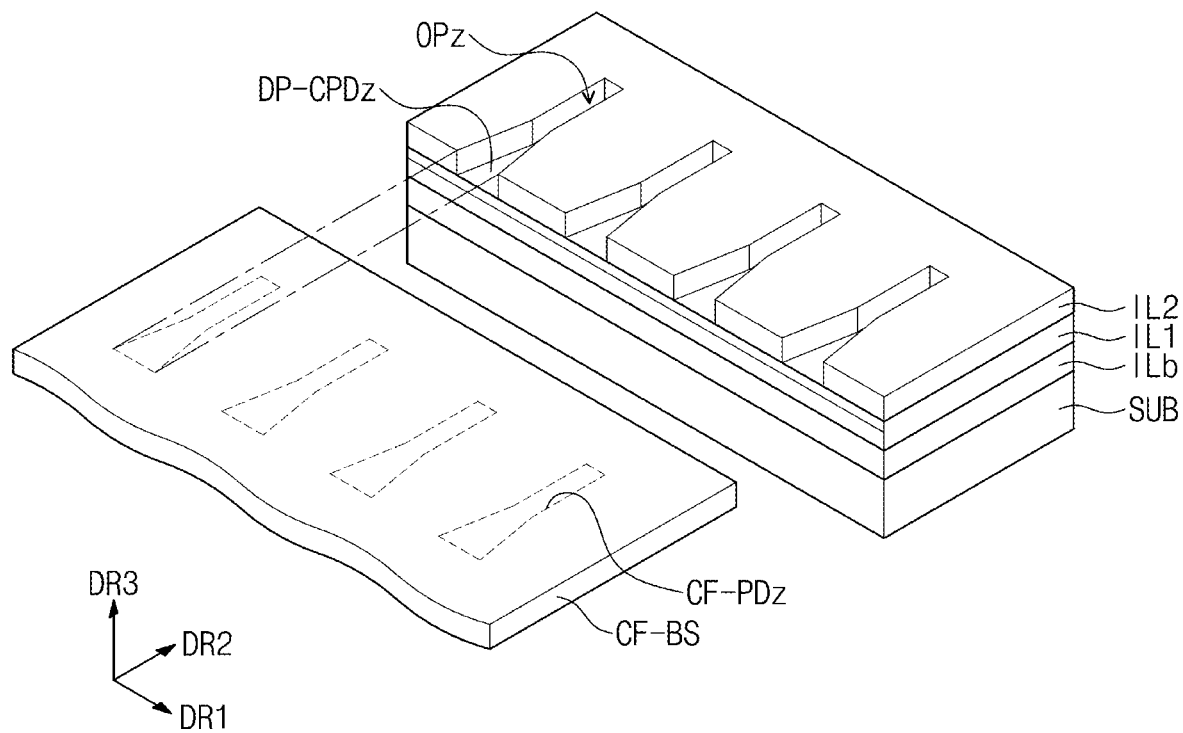
FIG. 7B is an exploded perspective view illustrating a circuit board and a display panel according to another embodiment of the inventive concepts.
Figure 7C:
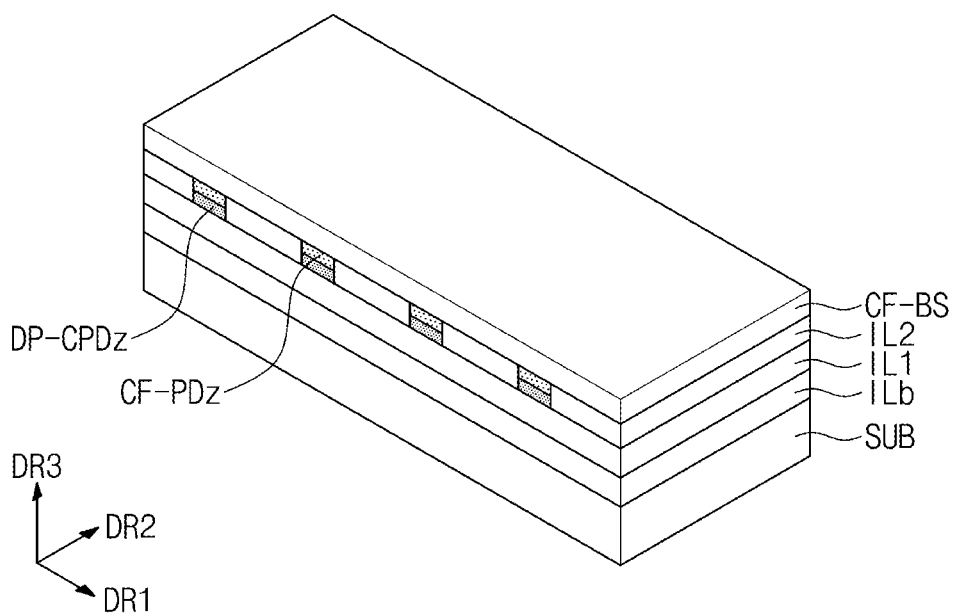
FIG. 7C is a perspective view illustrating a circuit board and a display panel according to another embodiment of the inventive concepts.

FIG. 7A is a plan view illustrating a circuit board CF and a display panel DP according to another embodiment of the inventive concepts. FIG. 7B is an exploded perspective view illustrating a circuit board and a display panel according to another embodiment of the inventive concepts. FIG. 7C is a perspective view illustrating a circuit board and a display panel according to another embodiment of the inventive concepts.

In FIGS. 7A to 7C, a bonding method of the circuit board CF and the display panel DP, which is different from that of the display device described with reference to FIG. 6A.

Referring to FIGS. 7A and 7B, driving pads DP-CPz may extend in one direction, i.e., a second direction DR2, and may include a portion having a trapezoid shape in a plane and the other portion having a rectangular shape in the plane. The driving pads DP-CPz may be spaced apart from each other in the plane and may be disposed on a first insulating layer IL1. Each of the driving pads DP-CPz may be exposed through engraved patterns OPz of a second insulating layer IL2. Particularly, according to the inventive concepts, the engraved patterns OPz may have a shape opened to the outside without being surrounded by the insulating layer IL2.

Circuit pads CF-PDz of the circuit board CF may respectively correspond to the driving pads DP-CPz. For instance, each of the circuit pads CF-PDz may have a portion having a trapezoid shape in the plane and the other portion having a rectangular shape in the plane, and the circuit pads CF-PDz may respectively correspond to the engraved patterns OPz.

According to the inventive concepts, as illustrated in FIG. 7B, the engraved patterns OPz may have the opened shape by the second insulating layer IL2, and thus, the circuit pads CF-PDz and driving pads DP-CPDz may face each other in a second direction DR2. The circuit pads CF-PDz may be respectively inserted into the engraved patterns OPz in the second direction DR2 after the circuit pads CF-PDz and the driving pads DP-CPDz are arranged to face each other in the second direction DR2.

That is, FIG. 5 illustrates the structure in which the circuit pad CF-PD is inserted into the engraved pattern OP in a third direction DR3, and FIG. 7B illustrates the structure in which the circuit pad CF-PDz is inserted into the engraved pattern OPz in the second direction DR2. As a result, as illustrated in FIG. 7C, the circuit pads CF-PDz and the driving pads DP-CPDz may be electrically in contact with each other.

Figure 8:
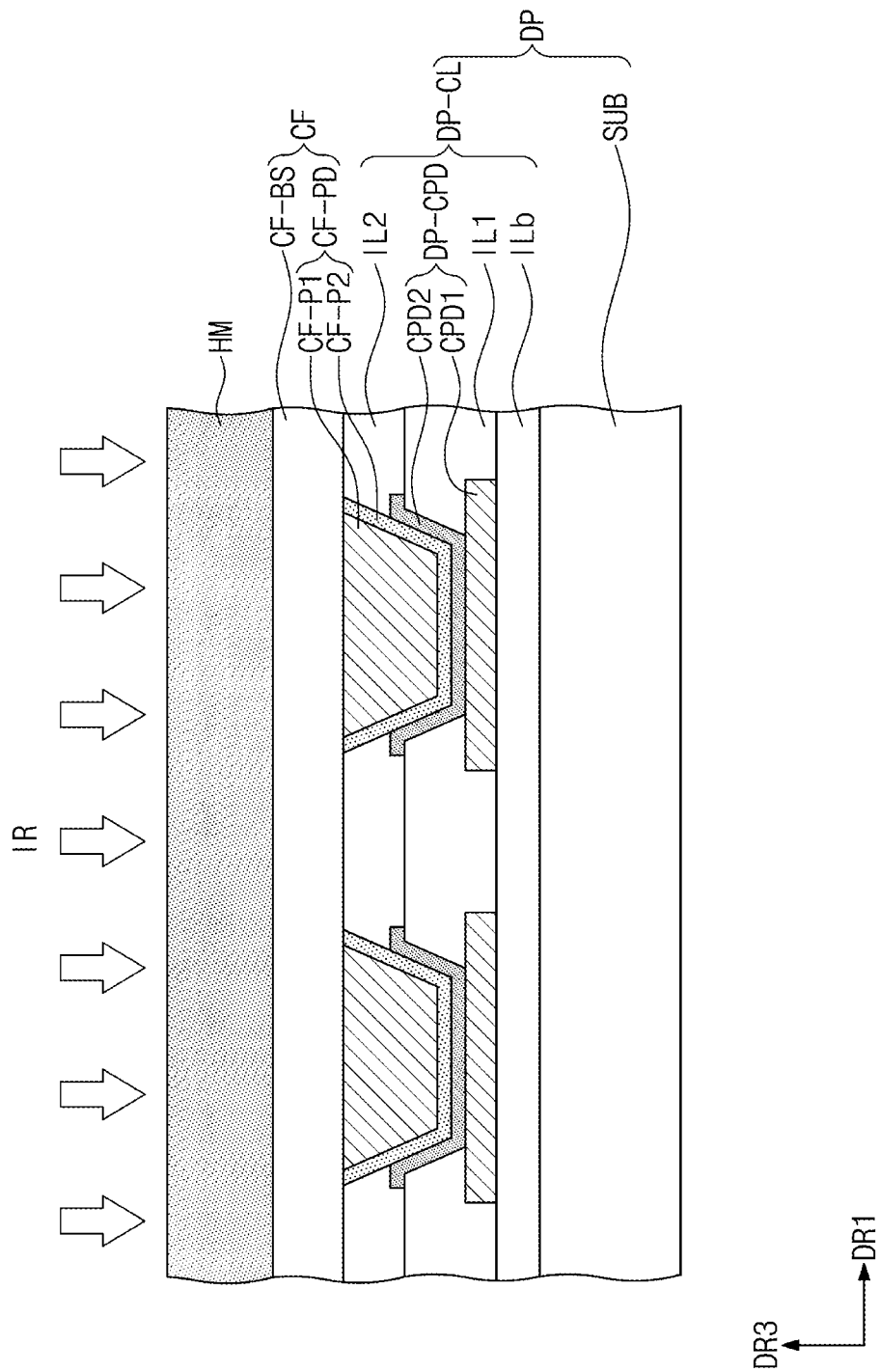
FIG. 8 is a cross-sectional view illustrating a display device according to another embodiment of the inventive concepts.

FIG. 8 is a cross-sectional view illustrating a display device according to another embodiment of the inventive concepts.

As described with reference to FIGS. 6A and 6B, a second insulating layer IL2 according to the inventive concepts may include an adhesive component and a photo-initiator. Hereinafter, a method of curing the second insulating layer IL2 with reference to FIG. 8.

An external structure HM may be disposed on a circuit board CF and may press the circuit board CF along a third direction DR3. The circuit board CF may be pressed to the display panel DP by the external structure HM. As a result, circuit pads CF-PD of the circuit board CF may be respectively inserted into the engraved patterns OP. The external structure HM may include a material with a transparent property, and may be, for example, quartz or sapphire.

Then, an external light IR may be irradiated to the second insulating layer IL2. As an example, the external light IR may be an ultraviolet light and may be irradiated to the second insulating layer IL2 after passing through the external structure HM. The second insulating layer IL2 may be cured by the external light IR, and thus, the circuit board CF and the display panel DP may be fixed to each other.

Although the embodiments of the inventive concepts have been described, it is understood that the inventive concepts should not be limited to these embodiments but various changes and modifications can be made by one ordinary skilled in the art within the spirit and scope of the inventive concepts as hereinafter claimed. Therefore, the disclosed subject matter should not be limited to any single embodiment described herein, and the scope of the present inventive concept shall be determined according to the attached claims.

What is claimed is:

1. A display device comprising:
    a substrate;
    a driving pad disposed on the substrate;
    an insulating layer disposed on the substrate covering the driving pad, and including an engraved pattern through which at least a portion of the driving pad is exposed; and
    a circuit board including a circuit pad having a shape inserted into the engraved pattern and making contact with the driving pad,
    wherein:
    the insulating layer comprises a first insulating layer disposed on the substrate and a second insulating layer disposed on the first insulating layer;
    the circuit board further comprises a support layer that supports the circuit pad; and
    the circuit pad comprises a plurality of circuit pads spaced apart from each other, and the second insulating layer makes contact with two circuit pads adjacent to each other among the plurality of circuit pads and the support layer.

2. The display device of claim 1, wherein a shape of the circuit pad is substantially a same shape of the engraved pattern.

3. The display device of claim 1, wherein the engraved pattern has a height that is the same as a height of the circuit pad in a thickness direction of the substrate.

4. The display device of claim 1, wherein a height of the circuit pad is greater than a height of the engraved pattern in a thickness direction of the substrate.

5. The display device of claim 1, wherein each of the first insulating layer and the second insulating layer is an organic layer.

6. The display device of claim 5, wherein the driving pad comprises:
    a first pad disposed on the substrate, at least a portion of the first pad being exposed by the first insulating layer; and
    a second pad partially covered by the second insulating layer, disposed on the exposed first pad through the engraved pattern, and making contact with the circuit pad, and the first pad and the second pad include different materials from each other.

7. The display device of claim 5, wherein the engraved pattern has a shape recessed from an upper surface of the second insulating layer to expose the driving pad.

8. The display device of claim 5, wherein the circuit pad comprises:
    a first circuit pad disposed on the support layer; and
    a second circuit pad covering the first circuit pad and facing the driving pad.

9. The display device of claim 8, wherein the second insulating layer is disposed between the two circuit pads adjacent to each other among the circuit pads.

10. The display device of claim 5, wherein the second insulating layer comprises:
    a photo-initiator and the second insulating layer is an adhesive component.

11. The display device of claim 1, wherein the insulating layer surrounds the driving pad in a plane.

12. The display device of claim 1, wherein the engraved pattern has a shape opened from the insulating layer in a plane.

13. The display device of claim 12, wherein each of the driving pad and the circuit pad has a trapezoid shape in the plane.

14. A method of manufacturing a display device, comprising:

providing a display substrate having an insulating layer through which an engraved pattern is defined and a driving pad partially exposed through the engraved pattern;

aligning a circuit pad of a circuit board to face the driving pad of the display substrate in a thickness direction of the display substrate;

inserting the circuit pad into the engraved pattern to allow the circuit pad to make contact with the driving pad, wherein the circuit pad has a shape that is the same as a shape of the engraved pattern in a plane, wherein:

the insulating layer comprises a first insulating layer disposed on the display substrate and a second insulating layer disposed on the first insulating layer;

the circuit board further comprises a support layer that supports the circuit pad; and the circuit pad comprises a plurality of circuit pads spaced apart from each other, and the second insulating layer makes contact with the two circuit pads adjacent to each other among the plurality of circuit pads and the support layer.

15. The method of claim 14, further comprising:

curing the insulating layer after the inserting of the circuit pad into the engraved pattern, wherein the insulating layer has an adhesive component and includes a photoinitiator.

16. The method of claim 14, wherein the insulating layer surrounds the driving pad in the plane, and the engraved pattern has a shape recessed from an upper surface of the insulating layer.

17. A method of manufacturing a display device, comprising:

providing a display substrate having an insulating layer through which an engraved pattern is defined and extends in one direction and a driving pad partially exposed through the engraved pattern;

aligning a circuit pad of a circuit board to face the driving pad of the display substrate in the one direction; and inserting the circuit pad into the engraved pattern in the one direction to allow the circuit pad to make contact with the driving pad, wherein:

the insulating layer comprises a first insulating layer disposed on the display substrate and a second insulating layer disposed on the first insulating layer;

the circuit board further comprises a support layer that supports the circuit pad; and the circuit pad comprises a plurality of circuit pads spaced apart from each other, and the second insulating layer makes contact with the two circuit pads adjacent to each other among the plurality of circuit pads and the support layer.

* * * * *